US007176935B2

(12) United States Patent
Higgins

(10) Patent No.: US 7,176,935 B2
(45) Date of Patent: Feb. 13, 2007

(54) GAMUT CONVERSION SYSTEM AND METHODS

(75) Inventor: Michael Francis Higgins, Cazadaro, CA (US)

(73) Assignee: Clairvoyante, Inc., Sebastopol, CA (US)

( * ) Notice: Subject to any disclaimer, the term of this patent is extended or adjusted under 35 U.S.C. 154(b) by 0 days.

(21) Appl. No.: 10/690,716

(22) Filed: Oct. 21, 2003

(65) Prior Publication Data

US 2005/0083344 A1 Apr. 21, 2005

(51) Int. Cl.
*G09G 5/02* (2006.01)
*G03F 3/08* (2006.01)

(52) U.S. Cl. ...................................... 345/589; 358/520

(58) Field of Classification Search ................ 345/589, 345/590, 591, 604; 358/1.9, 518, 520
See application file for complete search history.

(56) References Cited

U.S. PATENT DOCUMENTS 4,439,759 A 3/1984 Fleming et al.
4,737,843 A 4/1988 Spencer
4,946,259 A 8/1990 Matino et al.
4,989,079 A 1/1991 Ito
5,416,890 A * 5/1995 Beretta ....................... 345/590
5,438,649 A * 8/1995 Ruetz ......................... 358/1.9
5,448,652 A 9/1995 Vaidyanathan et al.
5,450,216 A 9/1995 Kasson
5,642,176 A 6/1997 Abukawa et al.
5,661,371 A 8/1997 Salerno et al.
5,694,186 A 12/1997 Yanagawa et al.
5,719,639 A 2/1998 Imamura
5,724,112 A 3/1998 Yoshida et al.
5,724,442 A * 3/1998 Ogatsu et al. .............. 382/167
5,731,818 A * 3/1998 Wan et al. .................. 345/590
5,748,828 A 5/1998 Steiner et al.
5,751,268 A 5/1998 Sheridon
5,880,707 A 3/1999 Aratani
5,899,550 A 5/1999 Masaki
5,903,366 A 5/1999 Hirabayashi et al.
5,917,556 A 6/1999 Katayama (Continued)

FOREIGN PATENT DOCUMENTS

GB 2 282 928 A 4/1995

(Continued)

OTHER PUBLICATIONS

USPTO, Notice of Allowance, dated Mar. 21, 2005 in US Patent No. 6,980,219 (U.S. Appl. No. 10/691,200).

*Primary Examiner*—Matthew Luu

(57) ABSTRACT

Systems and methods are disclosed to effect a gamut conversion of source image data to a target image data set for rendering on a device with possibly a different gamut. One gamut conversion system comprises an input channel means, a gamma unit, a chorma/luma unit, a hue angle calculator, and a gamut conversion unit. The input channel means receives source image data. The gamma unit converts the source image data into perceptually uniform space data. The chroma/luma unit converts the preceptiually uniform space data into a format comprising chroma and luma components. The hue angle calculator receives at least the chroma components from the chroma/luma unit and calculates hue angles for the source image data based on received components. The gamut conversion unit derives gamut conversion values to apply to the components of the source image data using a gamut conversion table.

12 Claims, 6 Drawing Sheets

U.S. PATENT DOCUMENTS

| | | | |
|---|---|---|---|
| 5,929,843 | A | 7/1999 | Tanioka |
| 5,933,253 | A * | 8/1999 | Ito et al. .................... 358/518 |
| 5,987,165 | A * | 11/1999 | Matsuzaki et al. .......... 382/162 |
| 5,990,997 | A | 11/1999 | Jones et al. |
| 5,995,669 | A | 11/1999 | Shingu et al. |
| 6,054,832 | A | 4/2000 | Kunzman et al. |
| 6,100,872 | A | 8/2000 | Aratani et al. |
| 6,108,053 | A | 8/2000 | Pettitt et al. |
| 6,147,728 | A | 11/2000 | Okumura et al. |
| 6,256,425 | B1 | 7/2001 | Kunzman |
| 6,262,698 | B1 | 7/2001 | Blum |
| 6,297,826 | B1 | 10/2001 | Semba et al. |
| 6,360,008 | B1 * | 3/2002 | Suzuki et al. ............... 358/518 |
| 6,384,836 | B1 | 5/2002 | Naylor, Jr. et al. |
| 6,453,067 | B1 | 9/2002 | Morgan et al. |
| 6,459,419 | B1 | 10/2002 | Matsubayashi |
| 6,483,518 | B1 | 11/2002 | Perry et al. |
| 6,536,904 | B2 | 3/2003 | Kunzman |
| 6,633,302 | B1 | 10/2003 | Ohsawa et al. |
| 6,714,212 | B1 | 3/2004 | Tsuboyama et al. |
| 6,714,243 | B1 | 3/2004 | Mathur et al. |
| 6,724,934 | B1 | 4/2004 | Lee et al. |
| 6,750,874 | B1 | 6/2004 | Kim |
| 6,771,028 | B1 | 8/2004 | Winters |
| 6,781,626 | B1 | 8/2004 | Wang |
| 6,980,219 | B2 | 12/2005 | Higgins |
| 2001/0019382 | A1 | 9/2001 | Song et al. |
| 2002/0063670 | A1 | 5/2002 | Yoshinaga et al. |
| 2002/0180688 | A1 | 12/2002 | Drzalc et al. |
| 2002/0191130 | A1 | 12/2002 | Liang et al. |
| 2003/0058466 | A1 | 3/2003 | Hoshuyama |
| 2003/0117457 | A1 * | 6/2003 | Qiao .......................... 347/43 |
| 2003/0128872 | A1 | 7/2003 | Lee et al. |
| 2003/0151694 | A1 | 8/2003 | Lee et al. |
| 2003/0179212 | A1 | 9/2003 | Matsushiro et al. |
| 2003/0193056 | A1 | 10/2003 | Takayama et al. |
| 2003/0214499 | A1 | 11/2003 | Ohsawa et al. |
| 2004/0046725 | A1 | 3/2004 | Lee |
| 2004/0072380 | A1 | 4/2004 | Yamazaki et al. |
| 2004/0095521 | A1 | 5/2004 | Song et al. |
| 2004/0169807 | A1 | 9/2004 | Rho et al. |
| 2004/0179160 | A1 | 9/2004 | Rhee et al. |
| 2004/0195963 | A1 | 10/2004 | Choi et al. |
| 2004/0222999 | A1 | 11/2004 | Choi et al. |
| 2004/0223005 | A1 | 11/2004 | Lee |
| 2005/0031199 | A1 | 2/2005 | Ben-Chorin et al. |
| 2005/0083341 | A1 | 4/2005 | Higgins et al. |
| 2005/0083352 | A1 | 4/2005 | Higgins |
| 2005/0225562 | A1 | 10/2005 | Higgins et al. |

FOREIGN PATENT DOCUMENTS

| | | |
|---|---|---|
| JP | 6-261332 | 9/1994 |
| WO | WO 01/37251 A1 | 5/2001 |
| WO | WO 2004/086128 A1 | 10/2004 |

* cited by examiner

GAMUT CONVERSION SYSTEM AND METHODS

RELATED APPLICATIONS

The present application is related to commonly owned United States Patent Applications: (1) U.S. Pat. Publication No. 2005/0083345 ('the '345 application) entitled "HUE ANGLE CALCULATION SYSTEM AND METHODS"; (2) U.S. Pat. Publication No. 2005/0083341 ('the '341 application) entitled "METHOD AND APPARATUS FOR CONVERTING FROM SOURCE COLOR SPACE TO RGBW TARGET COLOR SPACE"; (3) U.S. Pat. Publication No. 2005/0083352 ('the '352 application) entitled "METHOD AND APPARATUS FOR CONVERTING FROM A SOURCE COLOR SPACE TO A TARGET COLOR SPACE", which are hereby incorporated herein by reference.

BACKGROUND

In commonly owned United States Patent Applications: (1) U.S. Pat. Publication No. 2002/0015110 ('the '110 application) [U.S. patent application Ser. No. 09/916,232], entitled "ARRANGEMENT OF COLOR PIXELS FOR FULL COLOR IMAGING DEVICES WITH SIMPLIFIED ADDRESSING," filed Jul. 25, 2001; (2) U.S. Pat. Publication No. 2003/0128225 ('the '225 application) [U.S. patent application Ser. No. 10/278,353], entitled "IMPROVEMENTS TO COLOR FLAT PANEL DISPLAY SUB-PIXEL ARRANGEMENTS AND LAYOUTS FOR SUB-PIXEL RENDERING WITH INCREASED MODULATION TRANSFER FUNCTION RESPONSE," filed Oct. 22, 2002; (3) U.S. Pat. Publication No. 2003/0128179 ('the '179 application) [U.S. patent application Ser. No. 10/278,352], entitled "IMPROVEMENTS TO COLOR FLAT PANEL DISPLAY SUB-PIXEL ARRANGEMENTS AND LAYOUTS FOR SUB-PIXEL RENDERING WITH SPLIT BLUE SUB-PIXELS," filed Oct. 22, 2002; (4) U.S. Pat. Publication No. 2004/0051724 ('the '724 application) [U.S. patent application Ser. No. 10/243,094], entitled "IMPROVED FOUR COLOR ARRANGEMENTS AND EMITTERS FOR SUB-PIXEL RENDERING," filed Sep. 13, 2002; (5) U.S. Pat. Publication No. 2003/0117423 ('the '423 application) [U.S. patent application Ser. No. 10/278, 328], entitled "IMPROVEMENTS TO COLOR FLAT PANEL DISPLAY SUB-PIXEL ARRANGEMENTS AND LAYOUTS WITH REDUCED BLUE LUMINANCE WELL VISIBILITY," filed Oct. 22, 2002; (6) U.S. Pat. Publication No. 2003/0090581 ('the '581 application) [U.S. patent application Ser. No. 10/278,393], entitled "COLOR DISPLAY HAVING HORIZONTAL SUB-PIXEL ARRANGEMENTS AND LAYOUTS," filed Oct. 22, 2002; (7) U.S. Pat. Publication No. 2004/0080479 ('the '479 application") [U.S. patent application Ser. No. 10/347,001] entitled "IMPROVED SUB-PIXEL ARRANGEMENTS FOR STRIPED DISPLAYS AND METHODS AND SYSTEMS FOR SUB-PIXEL RENDERING SAME," filed Jan. 16, 2003, novel sub-pixel arrangements are therein disclosed for improving the cost/performance curves for image display devices and herein incorporated by reference.

For certain subpixel repeating groups having an even number of subpixels in a horizontal direction, the following systems and techniques to affect proper dot inversion schemes are disclosed and are herein incorporated by reference: (1) U.S. Pat. Publication No. 2004/0246280 ('the '280 application) [U.S. patent application Ser. No. 10/456, 839] entitled "IMAGE DEGRADATION CORRECTION IN NOVEL LIQUID CRYSTAL DISPLAYS"; filed Jun. 6, 2003, (2) U.S. Pat. Publication No. 2004/0246213 ('the '213 application) [U.S. patent application Ser. No. 10/455,925] entitled "DISPLAY PANEL HAVING CROSSOVER CONNECTIONS EFFECTING DOT INVERSION"; filed Jun. 6, 2003, (3) U.S. Pat. Publication No. 2004/0246381 ('the '381 application) [U.S. patent application Ser. No. 10/455,931] entitled "SYSTEM AND METHOD OF PERFORMING DOT INVERSION WITH STANDARD DRIVERS AND BACKPLANE ON NOVEL DISPLAY PANEL LAYOUTS"; filed Jun. 6, 2003, (4) U.S. Pat. Publication No. 2004/0246278 ('the '278 application) [U.S. patent application Ser. No. 10/455,927] entitled "SYSTEM AND METHOD FOR COMPENSATING FOR VISUAL EFFECTS UPON PANELS HAVING FIXED PATTERN NOISE WITH REDUCED QUANTIZATION ERROR"; filed Jun. 6, 2003, (5) U.S. Pat. Publication No. 2004/0246279 ('the '279 application) [U.S. patent application Ser. No. 10/456,806] entitled "DOT INVERSION ON NOVEL DISPLAY PANEL LAYOUTS WITH EXTRA DRIVERS"; and (6) U.S. Pat. Publication No. 2004/0246404 ('the '404 application) [U.S. patent application Ser. No. 10/456,838] entitled "LIQUID CRYSTAL DISPLAY BACKPLANE LAYOUTS AND ADDRESSING FOR NON-STANDARD SUBPIXEL ARRANGEMENTS" filed Jun. 6, 2003.

These improvements are particularly pronounced when coupled with sub-pixel rendering (SPR) systems and methods further disclosed in those applications and in commonly owned United States Patent Applications: (1) U.S. Pat. Publication No. 2003/0034992 ('the '992 application) [U.S. patent application Ser. No. 10/051,612], entitled "CONVERSION OF A SUB-PIXEL FORMAT DATA TO ANOTHER SUB-PIXEL DATA FORMAT," filed Jan. 16, 2002; (2) U.S. Pat. Publication No. 2003/0103058 ('the '058 application) [U.S. patent application Ser. No. 10/150,355], entitled "METHODS AND SYSTEMS FOR SUB-PIXEL RENDERING WITH GAMMA ADJUSTMENT," filed May 17, 2002; (3) U.S. Pat. Publication No. 2003/0085906 ('the '906 application) [U.S. patent application Ser. No. 10/215, 843], entitled "METHODS AND SYSTEMS FOR SUB-PIXEL RENDERING WITH ADAPTIVE FILTERING," filed Aug. 8, 2002; (4) U.S. Pat. Publication No. 2004/0196302 ('the '302 application) [U.S. patent application Ser. No. 10/379,767] entitled "SYSTEMS AND METHODS FOR TEMPORAL SUB-PIXEL RENDERING OF IMAGE DATA" filed Mar. 4, 2003; (5) U.S. Pat. Publication No. 2004/0174380 ('the '380 application) [U.S. patent application Ser. No. 10/379,765] entitled "SYSTEMS AND METHODS FOR MOTION ADAPTIVE FILTERING." filed Mar. 4, 2003; (6) U.S. Pat. Publication No. 2004/0174375 ('the '375 application) [U.S. patent application Ser. No. 10/379,766] entitled "SUB-PIXEL RENDERING SYSTEM AND METHOD FOR IMPROVED DISPLAY VIEWING ANGLES" filed Mar. 4, 2003; (7) U.S. Pat. Publication No. 2004/0196297 ('the '297 application) [U.S. patent application Ser. No. 10/409,413] entitled "IMAGE DATA SET WITH EMBEDDED PRE-SUBPIXEL RENDERED IMAGE" filed Apr. 7, 2003, which are hereby incorporated herein by reference.

BRIEF DESCRIPTION OF THE DRAWINGS

The accompanying drawings, which are incorporated in, and constitute a part of this specification illustrate exemplary implementations and embodiments of the invention and, together with the description, serve to explain principles of the invention.

DETAILED DESCRIPTION

Reference will now be made in detail to implementations and embodiments, examples of which are illustrated in the accompanying drawings. Wherever possible, the same reference numbers will be used throughout the drawings to refer to the same or like parts.

Most monitors and TVs today were designed to display three-valued color data such as RGB and/or sRGB or three-valued chroma/luminance signals such as YIQ or YCbCr. The term sRGB is used to describe the non-linear system that most personal computer images are assumed to be stored in. This is sometimes referred to as R'G'B' or non-linear RGB. To make brighter displays and displays with larger color gamuts, manufacturers are starting to consider multi-primary displays. These displays will have more than three primary colors. However, there are no convenient sources of multi-primary image data, and there are a large number of sources of three-valued color data that need to be converted for new multi-primary displays. In the process of converting images to multi-primary or other expanded gamut systems, it would be desirable to take advantage of the larger gamuts of these systems.

Methods and systems are disclosed that can convert the gamut, expanding or contracting, of existing three valued color data into gamuts that can take advantage of this new class of displays. Such methods and systems can work for multi-primary displays with any number of primaries.

Figure 4A:
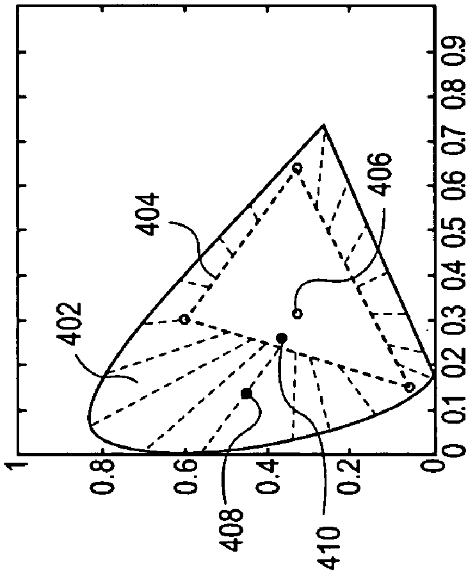
FIGS. 4A, 4B and 4C depict the gamuts of various image devices and the possible effects of gamut compression and/or expansion of the same.

One of the assumptions of gamut conversion is that TV cameras, digital cameras, and other input devices do not destroy the expanded gamut of the real world, but compress much of it into the limited gamut that they can represent, as suggested in FIG. 4A. For ease of computation, it is a further assumption of gamut conversion algorithms that this compression happens towards the white-point in a CIE chromaticity diagram. For example, as shown in FIG. 4A, the colors experienced in the real world are found in an area 402 outside of the gamut expressed by the image capture device (e.g. triangle 404). One such real world color 408 becomes compressed to color point 410, which is approximately co-linear with white point 406. This indicates that some of the lost gamut in these image sources can be reconstructed by stretching the gamut back out again.

Figure 4B:
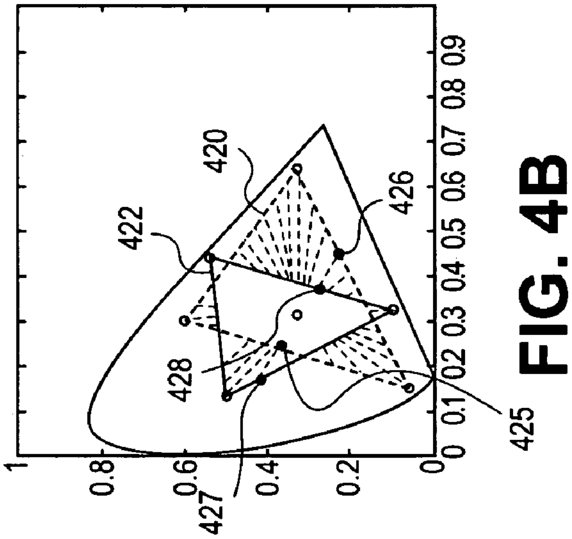

To see how the gamut of various devices interact, FIG. 4B shows the gamut of a monitor 420 superimposed on the gamut of a printer 422. At some ranges of colors, or hue angles, the saturation of the monitor gamut must be compressed more to fit into the printer gamut. For example, color point 426 is compressed to color point 428 to fit into printer gamut 422 (again, it is compressed towards the white point 424). While, at other hue angles, the saturation of the monitor gamut can be expanded back out again to take advantage of the printer gamut. For example, color point 425 could be expanded to color point 427.

Figure 4C:
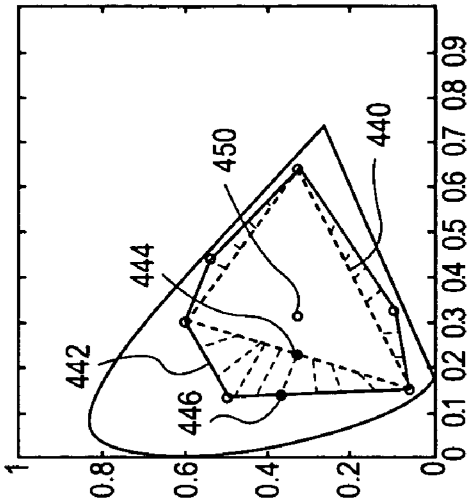

FIG. 4C depicts the monitor gamut 440 inside a hypothetical 6-primary multi-primary display gamut 442. At all hue angles, the monitor gamut is expanded to take advantage of the multi-primary gamut. For example, color point 444 could be expanded to meet color point 446 on the outer boundary of the multi-primary gamut 442. This expansion could take place co-linearly with the white point 450.

Many algorithms for conversion from one gamut to another have been published in the literature. The most frequent use is to convert sRGB display data for output on CMY color printers, as in FIG. 4B. The common feature of these algorithms is that they preserve hue angle. Typically, the color to be converted is first represented in a separate chroma/luma format. The chroma components can be multiplied by a value that increases or decreases the saturation. If both components of the chroma are multiplied by the same value, the hue and luma remain constant and only the saturation is changed. If the multiplicative value is less than one, the saturation will decrease. If the value is equal to one, the saturation will remain the same. If the value is greater than one, the saturation will increase. Typically, these gamut expansion algorithms are done in the CIE Lab or Luv color-spaces because these were designed to be perceptually uniform color spaces. This means converting to CIE Lab and back is typically required and these steps are computationally expensive.

In order to reduce the costs of computation, one embodiment will now be described. Since sRGB is already perceptually uniform, there is no need to convert to the computationally expensive CIE Lab. Instead, it may be desirable to convert sRGB directly into YCbCr, or some other even more computationally inexpensive conversion to separate chroma/luma. This is much easier to implement in hardware than conversion to CIE Lab. If the three-value color input happens already to be YCrCb, this is also a perceptually uniform system and can be used as they are without conversion. The same is true for most TV color-spaces, once they have been digitized, for example YPbPr, YUV and YIQ. If the source colors are linear RGB, a gamma conversion table can be used to convert them to sRGB first. Once the resulting color is in a perceptually uniform separate chroma/luma space, the hue angle may be computed. One such computationally inexpensive method of calculating the hue angle is described in the '345 application referenced above. Once hue angle is calculated, it is used as an index into a table of gamut expansion values. In one embodiment, the output of the expansion table could be expressed as a number between 0 and two, probably very close to one. These numbers can be represented as fixed-point binary numbers with one bit above the binary point. This allows for integer multipliers, with appropriate shifts afterwards, to be used to implement gamut expansion as an inexpensive system. The expansion number could be used to multiply both the components of chroma—thus, changing the saturation without effecting hue or luma.

For designing a system (for example, a monitor), such a system might have several input paths—e.g. sRGB, YCbCr, S-VHS, etc. For each of these paths, different hardware and/or software could service each of the several paths—particularly, if optional processing is not needed for the assumed image data input. For example, YCbCr would not necessarily need a chroma/luma separator because the space is already of that form. It could also be possible to design a system to read a header in the image data to discern which image data format is being input and optional subsystems and routines could be bypassed. Other possible embodiments and implementations are possible for designing a complete system that assumes different input and processing needs upon such different inputs.

Figure 1:
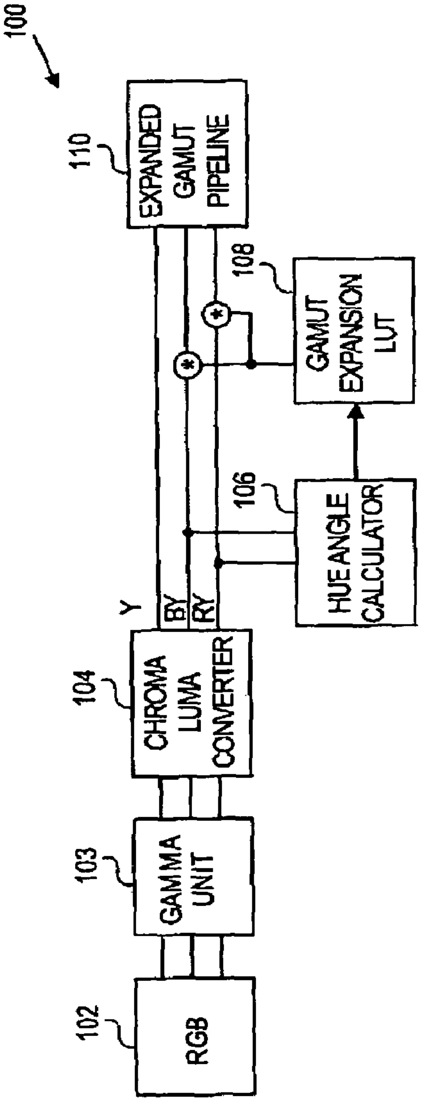
FIG. 1 shows one possible embodiment of gamut conversion/expansion system and/or method.

FIG. 1 depicts one embodiment of the present invention that provides of gamut expansion and/or conversion. System 100 inputs source image data 102 (e.g. RGB). If needed, the source image data is converted into a perceptually uniform color space at gamma unit 103. The data is then passed to chroma/luma converter 104. The chroma components from converter 104 are input into the hue angle calculator 106 and the hue angle is thereafter input into the gamut expansion block 108 (which could be implemented as a look-up in a table; or as a computation block itself). The output of this block is a gamut expansion number that may be used to scale both the chroma components with multipliers. The expanded chroma components are then output for further use by other components 110. It will be appreciated that other embodiments of the present invention are possible. As previously noted, the gamut expansion could be implemented in many possible ways, including but not limited to: a look-up table, a computational subsystem or the like. Additionally, other data paths are possible. FIG. 1 shows that the output of gamut expansion 108 could be applied to the chroma values output from 104; but alternatively, gamut expansion unit 108 could supply the chroma expansion value to the other components 110 directly.

As stated above, if the expansion number is less than one, it decreases the saturation of the color. If the number is one, it leaves the saturation substantially the same. If the number is greater than one, it increases the saturation and the gamut of the color. Of course, it is possible to implement alternative embodiments in which other numeric scales denote the same treatment of the image data.

Building the Gamut Conversion Table

Figure 2A:
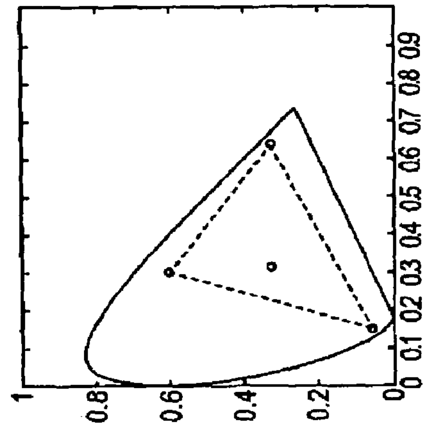
FIGS. 2A, 2B and 2C depict three different chromaticity diagrams for three different color spaces.
Figure 2B:
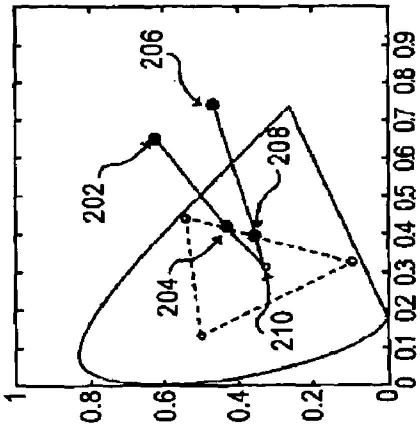
Figure 2C:
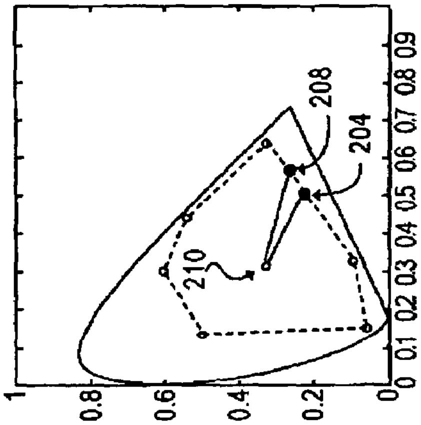

It will now be described one embodiment of a gamut conversion table and how to construct the same. One possible approach to building a gamut conversion table is to traverse the edges of the gamut of the input and output color-spaces. This is usually done in CIE Chromaticity space where the edges of the gamut are straight lines. FIGS. 2A, 2B and 2C show three different chromaticity diagrams for three different color spaces. These will serve as examples for generating gamut conversion tables.

FIG. 2A depicts the chromaticity diagram for the gamut of sRGB. FIG. 2B shows the chromaticity diagram for a CMY output device, such as a printer. FIG. 2C shows the chromaticity diagram of the gamut for a hypothetical 6-primary multi-primary display, in this case the combination of the gamuts of FIGS. 2A and 2B. It should be noted that the multi-primary gamut of FIG. 2C could in fact cover more area than simply the intersection of the two triangular gamuts of FIGS. 2A and 2B. Additionally, the methods and systems disclosed herein apply as well to any general n-primary display.

One embodiment to creating the gamut conversion table is to start by traversing the edges of the gamuts off-line beforehand. The resulting data then is used to generate gamut conversion tables that are burned into hardware implementations. The purpose of traversing the edges of each gamut is to generate an intermediate table of maximum saturation values. Of course, there may be intermediate values of saturation—apart from maximum—that may be of interest to the system. This table could be quantized to contain one value for each degree of hue. For convenience of this example, it will be assumed that the hues occupy 360 integer degrees around the color gamut. Of course, in another embodiment disclosed in a related and incorporated application, the units of angle could be changed to create a number of “degrees” around the gamut that is a power of two, for example 256. This change in degrees may make implementing gamut expansion easier in hardware.

Traversing these gamuts can be done in several ways. One way would be to generate one color in a perceptually uniform luma/chroma space for each hue angle but with arbitrarily chosen saturation and chroma. These colors can be converted to CIE chromaticity, corrected to lie on the edge of the gamut polygon, and then converted back to chroma/luma to get the maximum saturation values. To traverse the edges of the gamut, a color with each desired hue angle may be generated one after another. Color 202 in FIG. 2B may represent a color constructed with one hue angle value but arbitrary luminosity. It may be converted to CIE xy space. By interpolating a straight line between color 202 and the white-point 210, it may be possible to find the intersection with the gamut at color 204. The intersection may lie on any of the lines connecting primary colors of the gamut. This interpolation process may succeed if point 202 is inside or outside the gamut. Color 204 may then be converted back into the uniform luma/chroma space, such as CIE Lab where the magnitude of the vector ab is the saturation. This saturation may then be stored as the maximum for that hue angle. The process may be repeated for all desired hue angles, as indicated by showing another color 206 generated with a different hue angle and the resulting gamut intersection point 208. Another way to traverse the gamuts and generate maximum saturation values would be to linearly step along the edges of the gamut polygons in CIE chromaticity space, convert a set of points to luma/chroma and calculate the hue angle of each. If the linear steps are small enough, several luma/chroma pairs could be generated for each hue angle. The average saturation of all the pairs for each angle could be used as the maximum saturation for that angle. Of course, other resulting saturation values—besides averaging—could be calculated from the multiplicity of chroma/luma pairs and used in the gamut conversion table. Color 204 in FIG. 2C represents a color linearly interpolated in CIE xy space between two of the primaries in a gamut. This color is converted to hue and saturation by, for example, converting to CIE Lab where the angle of the vector ab is the hue angle and the magnitude is the saturation. The hue angle is rounded to the nearest desired angle and the saturation becomes, or contributes to, the maximum saturation. Color 208 represents the next step in a linear interpolation along the line between two primaries. This color may also be converted to hue and saturation. If the hue of color 208 is close to the hue of color 204 then the two saturations may be averaged or combined as described before. If the hue angles are sufficiently far apart the saturation of color 204 will become, or contribute to, the maximum saturation of a different hue angle in the table. The process may continue until points have been interpolated along all the lines connecting the outside of the gamut. Additionally, there are other ways of building a table of maximum saturation tables—the above two algorithms are only two of many possible embodiments.

Figure 3:
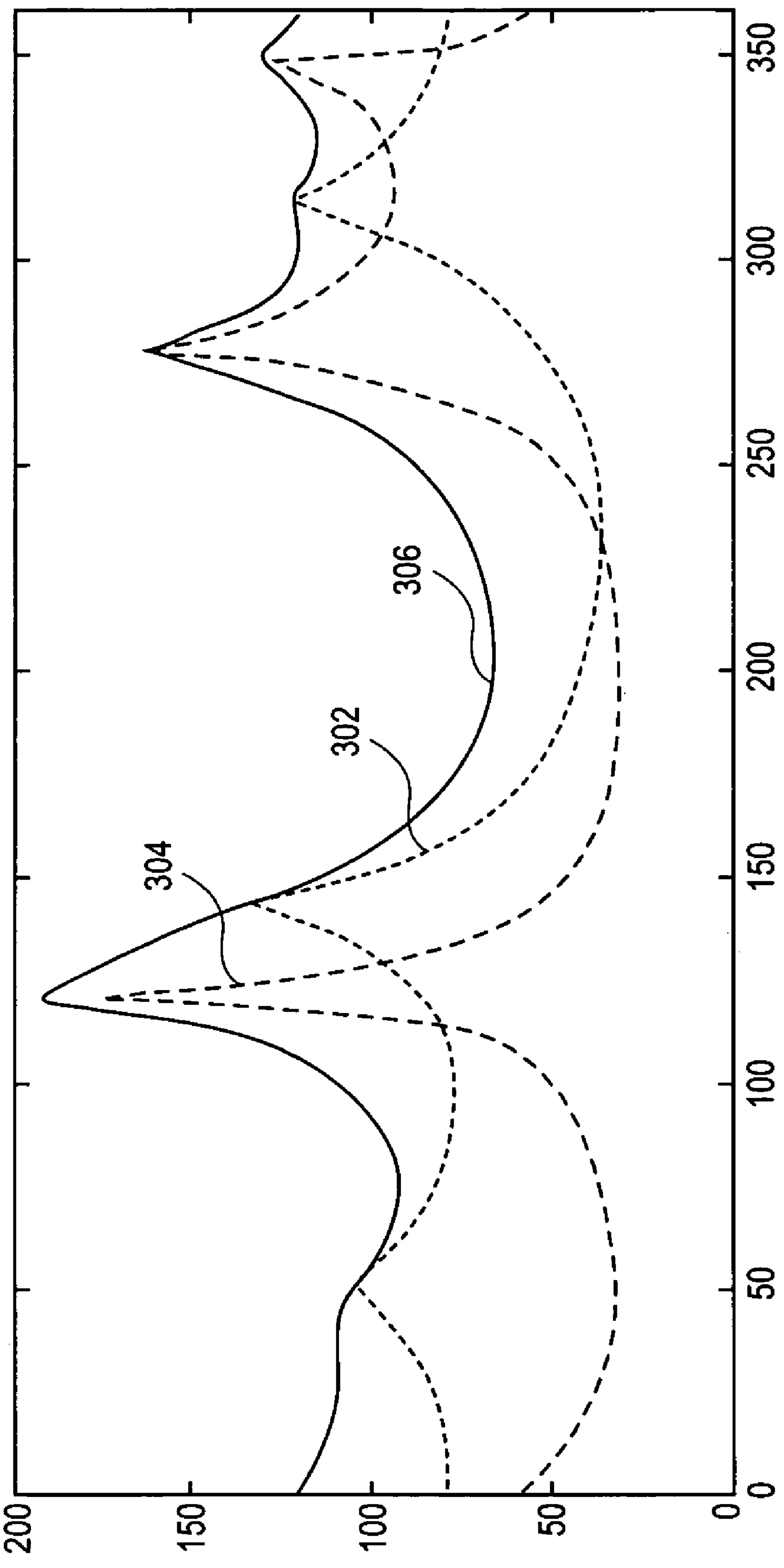
FIG. 3 shows the three maximum saturation tables generated for the three gamut polygons in FIGS. 2A, 2B, and 2C.

FIG. 3 shows the three maximum saturation tables generated for the three gamut polygons in FIG. 2. The horizontal axis of FIG. 3 is hue angle, running from 0 to 359 in this example. The vertical axis is distance from the white-point in CIE Lab space. In one embodiment, the system could use the actual values of the distances from the white point. However, in another embodiment, the actual values need not be used directly. Instead, the ratio, as discussed below, of the different curves could be used. The dotted line 302 in FIG. 3 is the maximum saturation curve for the sRGB gamut of FIG. 2A, the dashed line 304 is the maximum saturation curve for the CMY gamut of FIG. 2B, and the solid line 306 is the maximum saturation curve for the multi-primary gamut of FIG. 2C. Their respective curved shapes are the result of the non-linear perceptual uniformity of the CIE Lab color-space used for these examples.

The ratios of values in these maximum saturation curves could be used to generate the final gamut conversion tables. The ratio of the CMY and sRGB values, for example, could generate a gamut conversion table that would convert sRGB values into a gamut that may be a better fit for a CMY printer. It should be noted that, at some hue angles in FIG. 3, the sRGB curve 302 lies below the CMY curve 304. This will result in gamut conversion values greater than one, which will increase the saturation of colors with those hue angles. It should be also noted that at some hue angles in FIG. 3 the sRGB curve 302 lies above the CMY curve 304. This will result in gamut conversion values less than one, which will decrease the saturation of colors with those hue angles. This is the situation shown in FIG. 4B.

The ratio of the multi-primary to sRGB maximum saturation curves in FIG. 3, to choose a different example, would generate a gamut conversion table that would convert sRGB values into a gamut that would better fit a 6-primary display. It should be noted that at all hue angles in FIG. 3, the sRGB curve 302 lies on or below the multi-primary curve 306. This will result in gamut conversion values that are all greater than or equal to one, which will always increase the saturation of colors at all hue angles. This is the situation shown in FIG. 4C.

Gamut Conversion by Scaling Luma and/or Saturation

Figure 5:
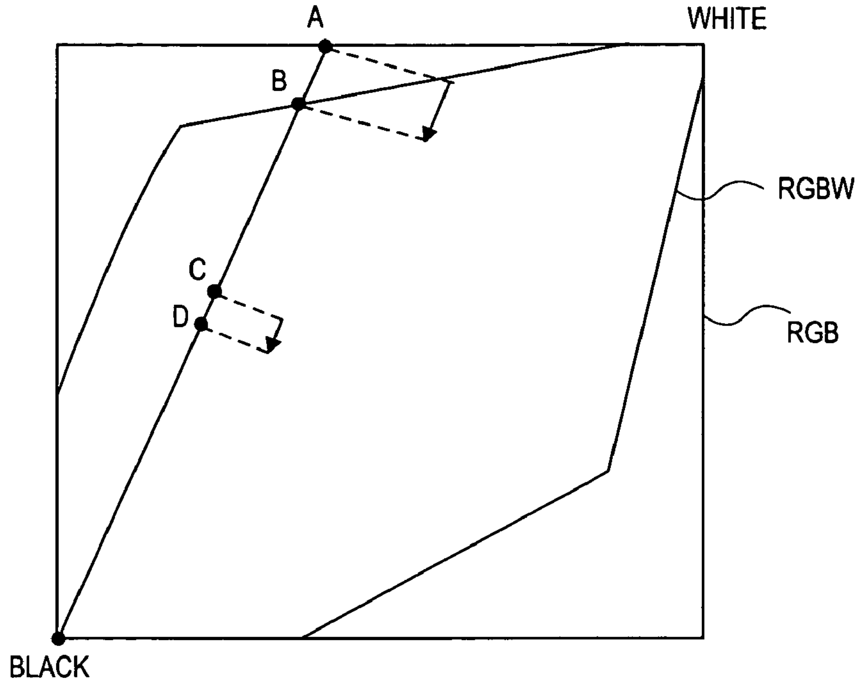
FIG. 5 is a diagram of two color gamuts substantially overlapping and the effects of gamut clamping and/or scaling.

As discussed in the related application entitled, "METHOD AND APPARATUS FOR CONVERTING FROM SOURCE COLOR SPACE TO RGBW TARGET COLOR SPACE", there is described a method and system for detecting out-of-gamut colors and moving them to a "good spot" on the surface of the output gamut space—where a "good spot" could be defined as one that has substantially the same hue as the out-of-gamut color. FIG. 5 shows a simplified two dimensional diagram of a case where an RGBW gamut fits inside the RGB gamut. Two techniques are particularly therein described: gamut clamping and gamut scaling. Gamut clamping would move any color between point A and B to point B on the surface of the RGBW gamut. Since all the colors between BLACK and point B are not out-of-gamut they would be left where they are. For example, gamut clamping will have no effect on the color at point C.

However, it might be advantageous to scale all the colors between BLACK and point A. This causes all colors on line BLACK-A to be scaled, so the color at point A moves to point B in FIG. 5. Colors between point A and B would be moved inside the gamut. Colors between BLACK and point B are also moved, for example the color at point C moves to point D.

Figure 6:
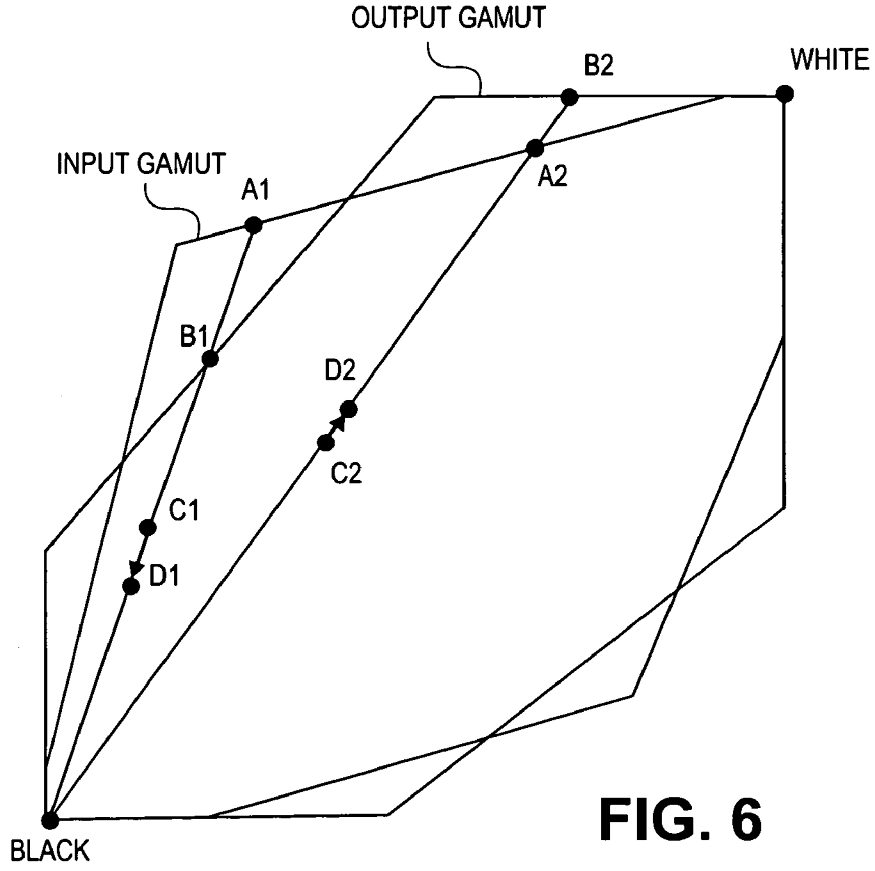
FIG. 6 is another diagram of two color gamuts that have significant areas of non-overlap and the effects of gamut clamping and/or scaling.

In some systems, the output gamut is a simple geometric case and it is possible to detect domains where one gamut was inside the other and to calculate the scale factor. In most multi-primary gamuts, however, the shapes of the gamuts are too complex to detect domains and the domains do not have simple geometric shapes. FIG. 6 shows a slightly more complex pair of gamuts. This is a picture of a slice through the two gamuts, perhaps both plotted in some third color-space such as CIE XYZ. In the three dimensional space of CIE XYZ, one of the gamuts may have a distorted cube shape, while the other is a more complex shape with more sides and ridges extending to new primary colors. FIG. 6 shows how sometimes the input gamut can extend outside the output gamut, and sometimes the reverse is true. This complex interpenetration is not shown on a simple CIE chromaticity diagram which essentially shows the gross outline of the gamut, not the details at different luminosities.

If gamut clamping alone is used, any color between point A1 and B1 would be moved to point B1 and colors between B1 and BLACK would be left untouched, including color C1. It should be noted that all the colors between point A2 and BLACK would be left untouched because they were already in-gamut.

However, if gamut scaling is used instead, the color at point A1 would be moved to B1 and all the colors on the line between A1 and B1 would be moved inside the gamut. Also all the colors between B1 and BLACK would be scaled, for example the color at point C1 would move to point D1. In addition, the colors on the line between BLACK and point A2 would be expanded, moving the color at A2 out of its original gamut to the point B2. Point C2, serving as an example for all the other colors on this line, would be moved slightly out as well to point D2. These two lines show that, in some domains, colors are scaled down to fit in the output gamut and in other regions the colors are scaled up to expand into the output gamut.

These scale factors are different for each unique combination of luma and saturation, so, in one embodiment, they could be pre-calculated and stored in a LUT. However this LUT might be quite large and impractical for most systems. Thus, another embodiment would calculate the scale factor on-the-fly for each color converted for a display system.

Referring to FIG. 5 again, one possible scale factor for converting the color at point C to point D might be the ratio of the lengths of the lines BLACK-B and the line BLACK-A. Given an arbitrary RGB color, C, with components between 0 and 1 it is possible to calculate the two points A and B in the output color-space. Point A will be out-of-gamut and point B will be just on the surface of the output gamut. The distance formula is used to find the lengths of the two lines and then their ratio is calculated.

To find the point A, it is possible to "normalize" point C in the input color-space. This could be accomplished by dividing all the components of color C by its maximum component. It should be noted that in a typical system the color components are integers between 0 and 255. In those cases, the results of the division is simply multiplied by 256 or shifted left 8 bits. For ease of explanation, the range of color components from 0 to 1 is used in the present discussion. It should also be noted that the division could be done by inverting the maximum value and multiplying all the components of color C by that inverse value. The inverse of a number can be stored in a LUT (look up table) and quickly fetched. After point C has been normalized, it is converted to the output color-space to get the color at point A. Given a function CONV that converts from the input to the output color-space, a function INV that returns the inverse of a number, and a function MAX that returns the maximum component of a color, the formula for calculating the point A is:

$$A=CONV(C*INV(\mathrm{MAX}(C)))$$

CONV, as a function, could be implemented by calculating the hue angle, using the hue angle to determine the chromaticity triangle number, and using that to select a multi-primary conversion matrix to perform the matrix multiply resulting in a color in the target color space. To find the point B, it is possible to convert point C to the output color-space and then normalize it. In the following formula, the color C is first converted to a temporary point C2, and then this is used to calculate the point B.

$$C2=CONV(C)$$

$$B=C2*INV(\mathrm{MAX}(C2)$$

Then a gamut scaling ratio for color C could be the ratio of the lengths of the lines from BLACK to point A and from BLACK to point B. Since BLACK is the zero point, the two points A and B can be treated as vectors and their magnitudes are equivalent to the length of the lines. This makes the ratio:

$$R=|B|/|A|$$

Finally, the converted color C2 (from the formula above) is multiplied by this scaling ratio to calculate the gamut scaled color D in FIG. 5.

$$D=C2*R$$

Figure 7:
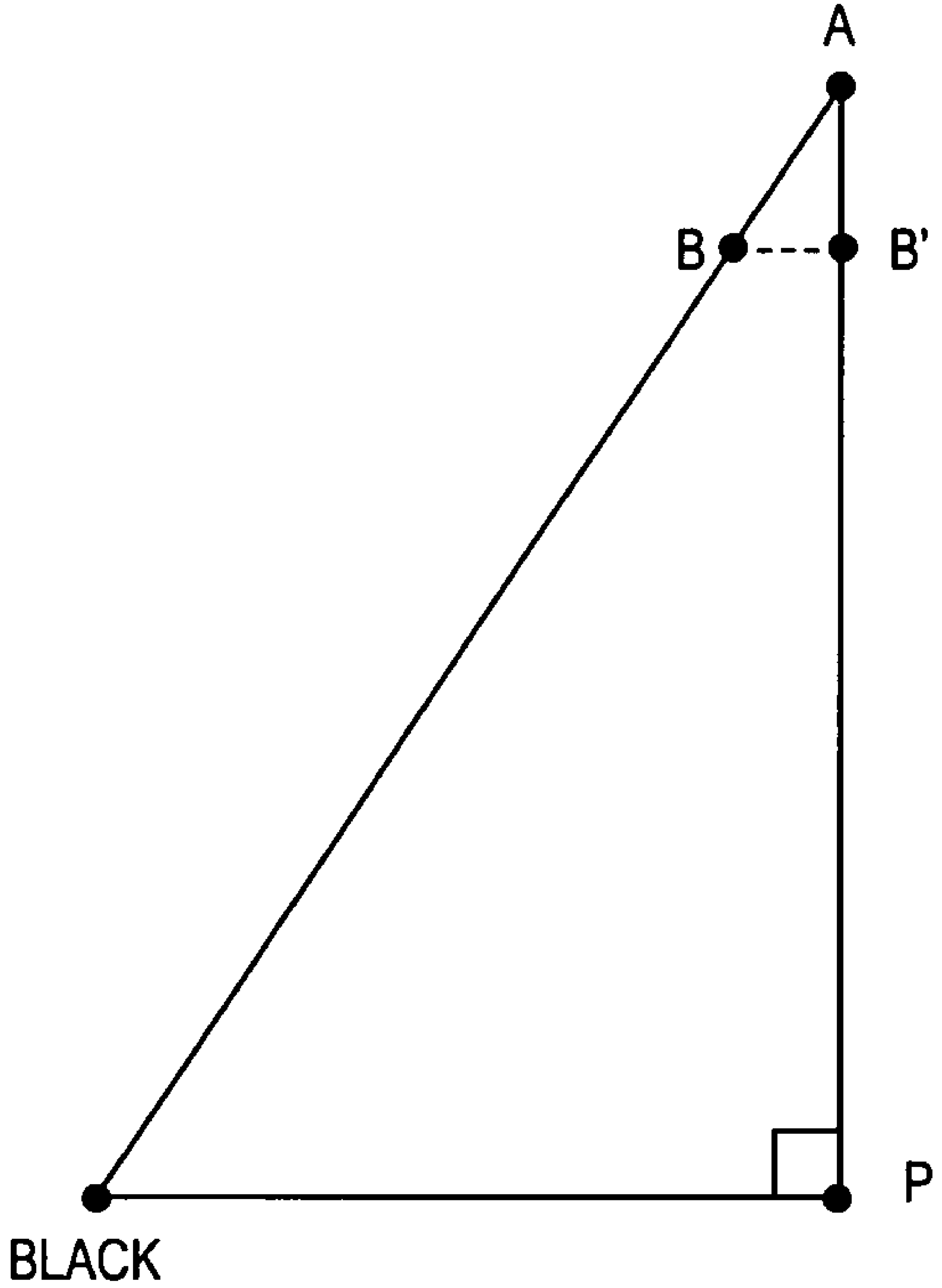
FIG. 7 is one possible embodiment of a technique for conversion of one gamut to another by calculation a scaling factor.

It should be noted that the process of calculating the magnitude of the colors A and B could be computationally expensive. FIG. 7 shows another embodiment of calculating these values. An orthogonal line is dropped from point A parallel to the maximum component of the color down to point P. By similar triangles, the ratio of the distance from BLACK to B and from BLACK to A is identical to the ratio of the distance from point P to B' and from P to A. The distances along the diagonal line from BLACK to points A and B must be calculated using the distance formula which involves multiplies and a square root, however the distances along the line from P to A and B' are simply the maximum components of the colors. This allows us to simplify the equation for the scaling ratio to:

$$R=\mathrm{MAX}(B)/\mathrm{MAX}(A)$$

However, the point B was chosen to lie on the surface of the output gamut, so it should have at least one component with the maximum value of one. Thus, the value 1 may be substituted for MAX(B) without needing to actually calculate the point B at all, resulting in a considerable savings in the resulting hardware. The value of R now becomes the inverse of MAX(A) and can be looked up in another inverse LUT:

$$R=INV(\mathrm{MAX}(A))$$

Figure 8:
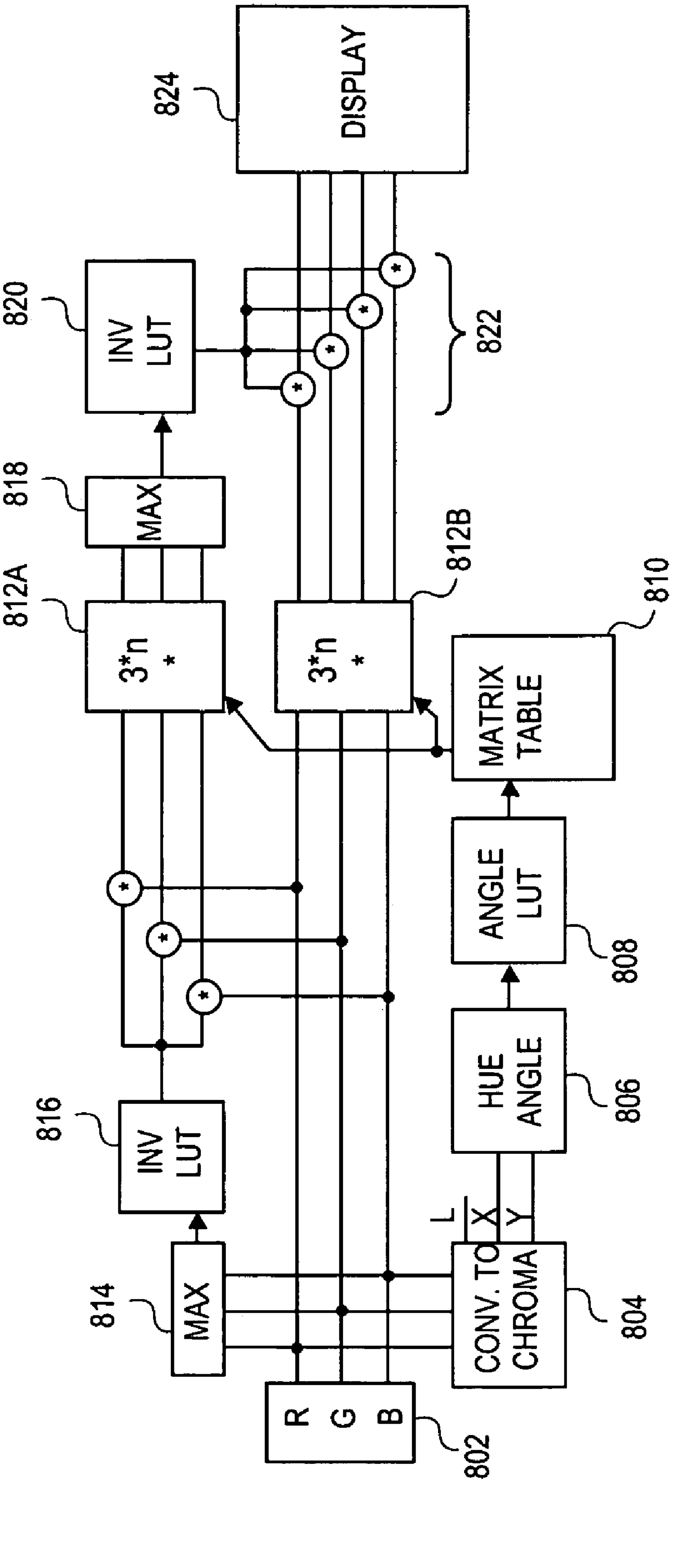
FIG. 8 is one possible embodiment of a system that performs the gamut conversion from one color space to another color space.

FIG. 8 shows one embodiment of a hardware implementation 800 of the present system. Input RGB values 802 may be split into three parallel paths. The bottom path first converts the RGB into separate chroma/luma in module 804. The chroma is used to calculate the hue angle 806. The luma value may not be used here but may be saved for other steps in other embodiments. The hue angle is used in a LUT 808 and Angle LUT 808 to determine in which chromaticity triangle the color lies. This is used to select a conversion matrix (in table 810) for use by the 3×n matrix multipliers 812*a* and 812*b* for converting color on the other two parallel paths.

The upper parallel path on FIG. 8 finds the maximum component (in module 814) of the source RGB color, and inverts that by looking it up in an inverse LUT 816. This inverse value is multiplied by all the components of the source RGB color to normalize it. Then the color is converted to the output color-space (in matrix multiplier 812*a*), the maximum component is found (in module 818), and this is inverted (in INV LUT 820) to create the gamut scaling ratio.

The center parallel path on FIG. 8 converts the source RGB color to the output color-space (in matrix multiplier 812*b*), then multiplies (in multipliers 822) each resulting component by the gamut scaling ratio from the upper path. Although four output primaries are shown in FIG. 8, it should be appreciated that there can be any number. These color points are sent on to be displayed (824).

In the first embodiment of gamut conversion, as shown in FIG. 1, it may be reasonable to assume that the expansion is substantially constant for all luminosities. If it is not, then some out-of-gamut colors will result and gamut clamping or scaling or the like may be desirable. In the second embodiment of gamut conversion, as shown in FIG. 8, those two steps may be combined as one. In this embodiment it is possible to perform on-the-fly gamut ratio calculation—which could be used as a gamut conversion algorithm that would also substantially fill the output gamut with all the colors in the input gamut. In the case of RGBW from RGB, the RGBW gamut lies completely inside the RGB gamut. If the ratio to the edges of the two gamuts is calculated for every input pixel value, the ratio (RGBW/RGB) would always be less than one and would scale colors down into the RGBW gamut, as in FIG. 5. In the case of RGBC (C is cyan or another color) from RGB, the RGBC gamut is inside the RGB gamut for some colors and outside for others as in FIG. 6. When RGBC is outside RGB, the ratio would be greater than one and expand the gamut to fit. When RGBC is inside RGB, the ratio would be less than one and shrink the gamut to fit.

In the above embodiments, reference to functional blocks can be implemented using any combination of hardware and/or software, including components or modules such as one or more memory devices or circuitry. For example, a programmable gate array or like circuitry can be configured to implement such functional blocks. In other examples, a microprocessor operating a program in memory can also implement such functional blocks.

While the invention has been described with reference to an exemplary embodiment, it will be understood by those skilled in the art that various changes may be made and equivalents may be substituted for elements thereof without departing from the scope of the invention. In addition, many modifications may be made to adapt a particular situation or material to the teachings without departing from the essential scope thereof. Therefore, it is intended that the invention not be limited to the particular embodiment disclosed as the best mode contemplated for carrying out this invention, but that the invention will include all embodiments falling within the scope of the appended claims.

What is claimed is:

1. A gamut conversion system comprising:

input channel means for receiving source image data;

a gamma unit configured to convert said source image data into perceptually uniform space data;

a chroma/luma unit configured to convert said perceptually uniform space data into a format comprising chroma and luma components of said source image data;

a hue angle calculator configured to receive at least the chroma components of said source image data from the chroma/luma unit and configured to calculate hue angles for said source image data based on said chroma components; and a gamut conversion unit configured to use said hue angles to derive gamut conversion values to apply to the chroma components of said source image data to produce image data values specified in an output gamut; said gamut conversion unit further comprising a means for adjusting out-of-gamut colors back into the output gamut.

2. The gamut conversion system of claim 1 wherein said source image data may bypass said chroma/luma unit, if said source image data is already in a format comprising chroma and luma components.

3. The gamut conversion system of claim 1 wherein said hue angle calculator calculates hue angles in degrees from zero to some power of two.

4. The gamut conversion system of claim 1 wherein said gamut conversion unit comprises a look-up table having pre-computed and stored gamut conversion values.

5. The gamut conversion system of claim 1 wherein the gamut conversion values are determined by traversing the edges of a plurality of gamuts to which said system is to apply conversion.

6. The gamut conversion system of claim 5 wherein said plurality of gamuts to which said system is to apply conversion comprises a plurality of a group, said group comprising: input gamuts, monitor gamuts and multi-primary gamuts.

7. The gamut conversion system of claim 1 wherein said gamut conversion unit derives said gamut conversion values by traversing the edge of a gamut polygon to generate a saturation value at each hue angle.

8. The gamut conversion system of claim 7 wherein said gamut conversion unit generates one color in a perceptually uniform chroma/luma space for each hue angle.

9. The gamut conversion system of claim 8 wherein said gamut conversion unit arbitrarily chooses saturation and chroma values for each hue angle, converts the color to CIE chromaticity, corrects the resulting color to substantially lie on the edge of the gamut polygon, and converts the color to chroma/luma.

10. The gamut conversion system of claim 7 wherein said gamut conversion values are generated along the edges of the gamut and, for a set of points along said edge, chroma/luma and hue angle data is generated.

11. The gamut conversion system of claim 10 wherein for each hue angle, a plurality of chroma/luma data is generated.

12. The gamut conversion system of claim 7 wherein ratios of saturation values are computed to convert one gamut space to another gamut space.

* * * * *